United States Patent
Hirai

(10) Patent No.: US 11,189,775 B2
(45) Date of Patent: Nov. 30, 2021

(54) COMPOSITE SUBSTRATE FOR PREVENTING BONDING FAILURE BETWEEN SUBSTRATES

(71) Applicant: BROTHER KOGYO KABUSHIKI KAISHA, Nagoya (JP)

(72) Inventor: Keita Hirai, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 739 days.

(21) Appl. No.: 16/015,944

(22) Filed: Jun. 22, 2018

(65) Prior Publication Data
US 2019/0103546 A1   Apr. 4, 2019

(30) Foreign Application Priority Data
Sep. 29, 2017   (JP) .............................. JP2017-192151

(51) Int. Cl.
| | |
|---|---|
| *H01L 41/04* | (2006.01) |
| *H01L 41/047* | (2006.01) |
| *B41J 2/14* | (2006.01) |
| *H01L 41/09* | (2006.01) |
| *H01L 41/187* | (2006.01) |

(52) U.S. Cl.
CPC ...... *H01L 41/0475* (2013.01); *B41J 2/14233* (2013.01); *H01L 41/042* (2013.01); *H01L 41/0973* (2013.01); *B41J 2002/14491* (2013.01); *B41J 2202/18* (2013.01); *H01L 41/1876* (2013.01)

(58) Field of Classification Search
None
See application file for complete search history.

(56) References Cited

U.S. PATENT DOCUMENTS

| | | |
|---|---|---|
| 2006/0231927 A1 | 10/2006 | Ohno |
| 2009/0014897 A1 | 1/2009 | Ohno |
| 2012/0249681 A1 | 10/2012 | Koide et al. |
| 2013/0027895 A1 | 1/2013 | Hayashi |
| 2014/0092167 A1* | 4/2014 | Nishi ................. B41J 2/161 347/20 |
| 2014/0264770 A1 | 9/2014 | Okandan et al. |

(Continued)

FOREIGN PATENT DOCUMENTS

| | | |
|---|---|---|
| JP | 2004-363573 A | 12/2004 |
| JP | 2012-206260 A | 10/2012 |

(Continued)

OTHER PUBLICATIONS

Japanese Office Action issued in corresponding Japanese Patent Application No. 2017-192151; dated Aug. 10, 2021.

*Primary Examiner* — Erica S Lin
(74) *Attorney, Agent, or Firm* — Merchant & Gould P.C.

(57) ABSTRACT

A composite substrate has: a first substrate having a first bump protruding therefrom; and a second substrate having a first surface in contact with the first bump, and a second surface opposite to the first surface, the second surface having a second bump protruding therefrom, the second substrate being laminated on the first substrate in a thickness direction perpendicular to the first surface. The first bump and the second bump are partially overlapped with each other as viewed in the thickness direction. The second bump has a rigidity which is lower than a rigidity of the first bump.

12 Claims, 11 Drawing Sheets

(56) References Cited

U.S. PATENT DOCUMENTS

| | | | |
|---|---|---|---|
| 2017/0028726 A1* | 2/2017 | Sato | B41J 2/1643 |
| 2017/0066241 A1 | 3/2017 | Naganuma et al. | |
| 2017/0313074 A1 | 11/2017 | Saimen et al. | |

FOREIGN PATENT DOCUMENTS

| | | |
|---|---|---|
| JP | 2013-191903 A | 9/2013 |
| JP | 2017-24372 A | 2/2017 |
| JP | 2017-052135 A | 3/2017 |
| JP | 2017-196786 A | 11/2017 |

* cited by examiner

COMPOSITE SUBSTRATE FOR PREVENTING BONDING FAILURE BETWEEN SUBSTRATES

CROSS REFERENCE TO RELATED APPLICATION

This application claims priority from Japanese Patent Application No. 2017-192151 filed Sep. 29, 2017. The entire content of the priority application is incorporated herein by reference.

TECHNICAL FIELD

The present disclosure relates to a composite substrate used for an inkjet head.

BACKGROUND

A composite substrate configured by stacking a plurality of substrates together has been used in conventional devices. This type of composite substrate has a structure known in the art that comprises bumps disposed between substrates.

In the conventional composite substrates, individual substrates tend to deform about the bumps when the substrates are bonded together, increasing the potential for bonding failure between substrates.

In view of the foregoing, it is an object of the present disclosure to provide a composite substrate which prevents bonding failure between substrates.

SUMMARY

The present disclosure provides a composite substrate having: a first substrate having a first bump protruding therefrom; and a second substrate having a first surface in contact with the first bump, and a second surface opposite to the first surface, the second surface having a second bump protruding therefrom, the second substrate being laminated on the first substrate in a thickness direction perpendicular to the first surface. The first bump and the second bump are partially overlapped with each other as viewed in the thickness direction. The second bump has a rigidity which is lower than a rigidity of the first bump.

BRIEF DESCRIPTION OF THE DRAWINGS

The particular features and advantages of the embodiment(s) as well as other objects will become apparent from the following description taken in connection with the accompanying drawings, in which.

DETAILED DESCRIPTION

Figure 1:
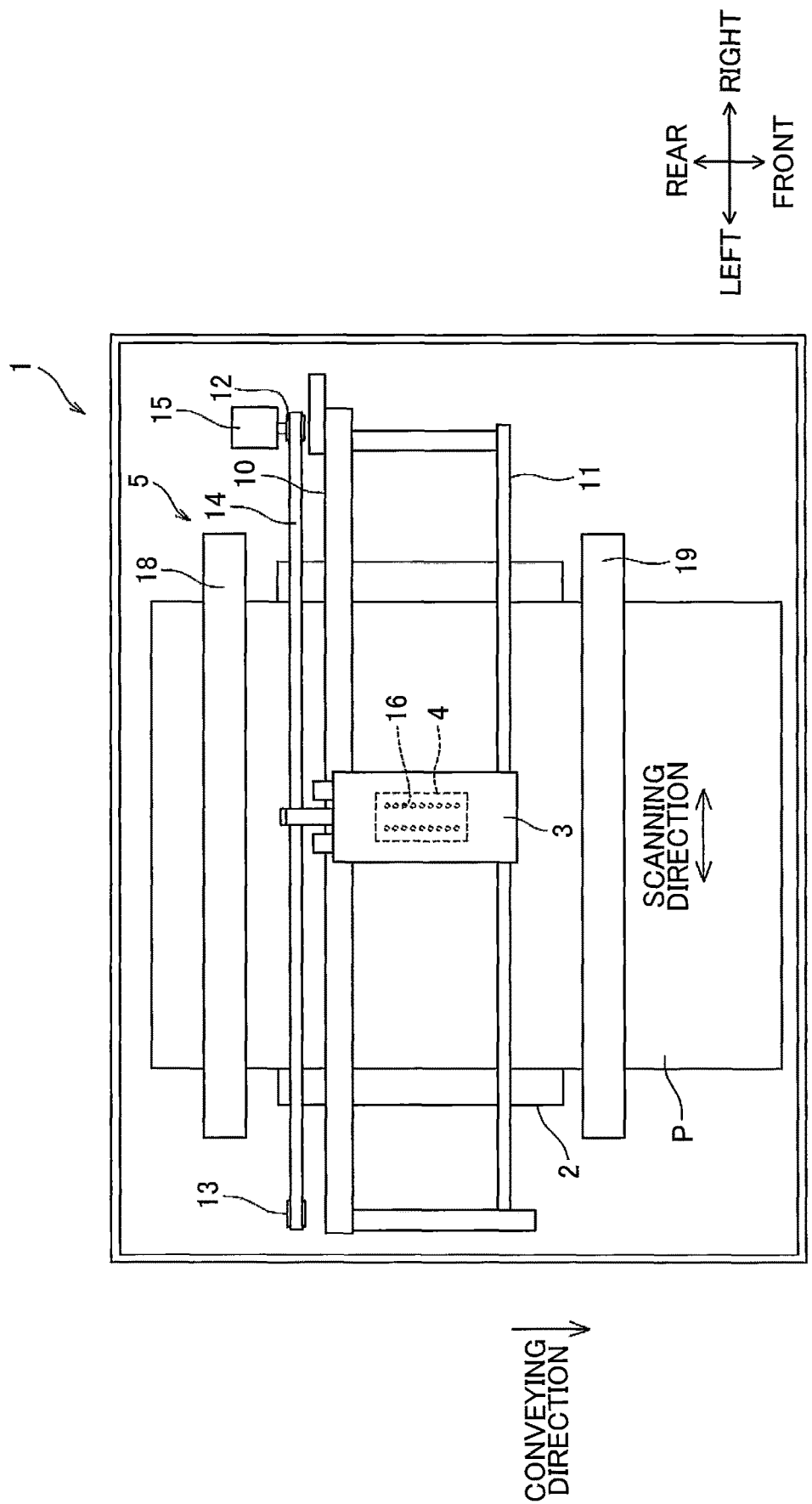
FIG. 1 is a schematic plan view showing an inkjet printer according to an embodiment.

Next, an embodiment will be described. FIG. 1 is a schematic plan view showing an inkjet printer 1 provided with an inkjet head 4 according to the embodiment. First, the overall structure of the inkjet printer 1 will be described with reference to FIG. 1. In the following description, the near side in the drawing of FIG. 1 will be defined as the top, the far side of the drawing will be defined as the bottom, the left side in the drawing will be defined as the left side and the right side in the drawing will be defined as the right side. In addition, the upstream side in a conveying direction described later will be defined as the rear side, and the downstream side of the conveying direction will be defined as the front side. Further, terminology related to directions such as up, down, left, right, front, and rear will be used as needed in the following description. As shown in FIG. 1, the inkjet printer 1 includes a platen 2, a carriage 3, the inkjet head 4, and a conveying mechanism 5.

A recording sheet P is supported on the top surface of the platen 2. The recording sheet P is a recording medium. Two guide rails 10 and 11 are provided above the platen 2. The guide rails 10 and 11 extend parallel to the left-right direction in FIG. 1 (a scanning direction). The carriage 3 is capable of reciprocating in the scanning direction along the guide rails 10 and 11 through a region opposing the platen 2. The carriage 3 is coupled to an endless belt 14. The endless belt 14 is looped around two pulleys 12 and 13. A carriage motor 15 drives the endless belt 14 to circulate about the pulleys 12 and 13. When the endless belt 14 is driven to circulate, the carriage 3 moves along the scanning direction.

The inkjet head 4 is mounted in the carriage 3 and moves along with the carriage 3 in the scanning direction. An ink cartridge (not shown) mounted in the inkjet printer 1 is connected to the inkjet head 4 by a tube. A plurality of nozzles 16 is formed in the bottom surface (the surface on the far side of FIG. 1) of the inkjet head 4. The inkjet head 4 ejects ink supplied from the ink cartridge through the nozzles 16 and onto the recording sheet P supported by the platen 2.

The conveying mechanism 5 has two conveying rollers 18 and 19 disposed on opposite sides of the platen 2 in the conveying direction. A motor (not shown) drives the conveying rollers 18 and 19 to rotate. The conveying rollers 18 and 19 of the conveying mechanism 5 convey the recording sheet P on the platen 2 in the conveying direction.

The inkjet printer 1 ejects ink from the inkjet head 4 toward the recording sheet P resting on the platen 2, as the inkjet head 4 reciprocates along with the carriage 3 in the scanning direction (the left-right direction in FIG. 1). In conjunction with this operation, the conveying rollers 18 and 19 convey the recording sheet P in the conveying direction. Through these operations, images, text, and the like are recorded on the recording sheet P.

<Inkjet Head 4>

Figure 2:
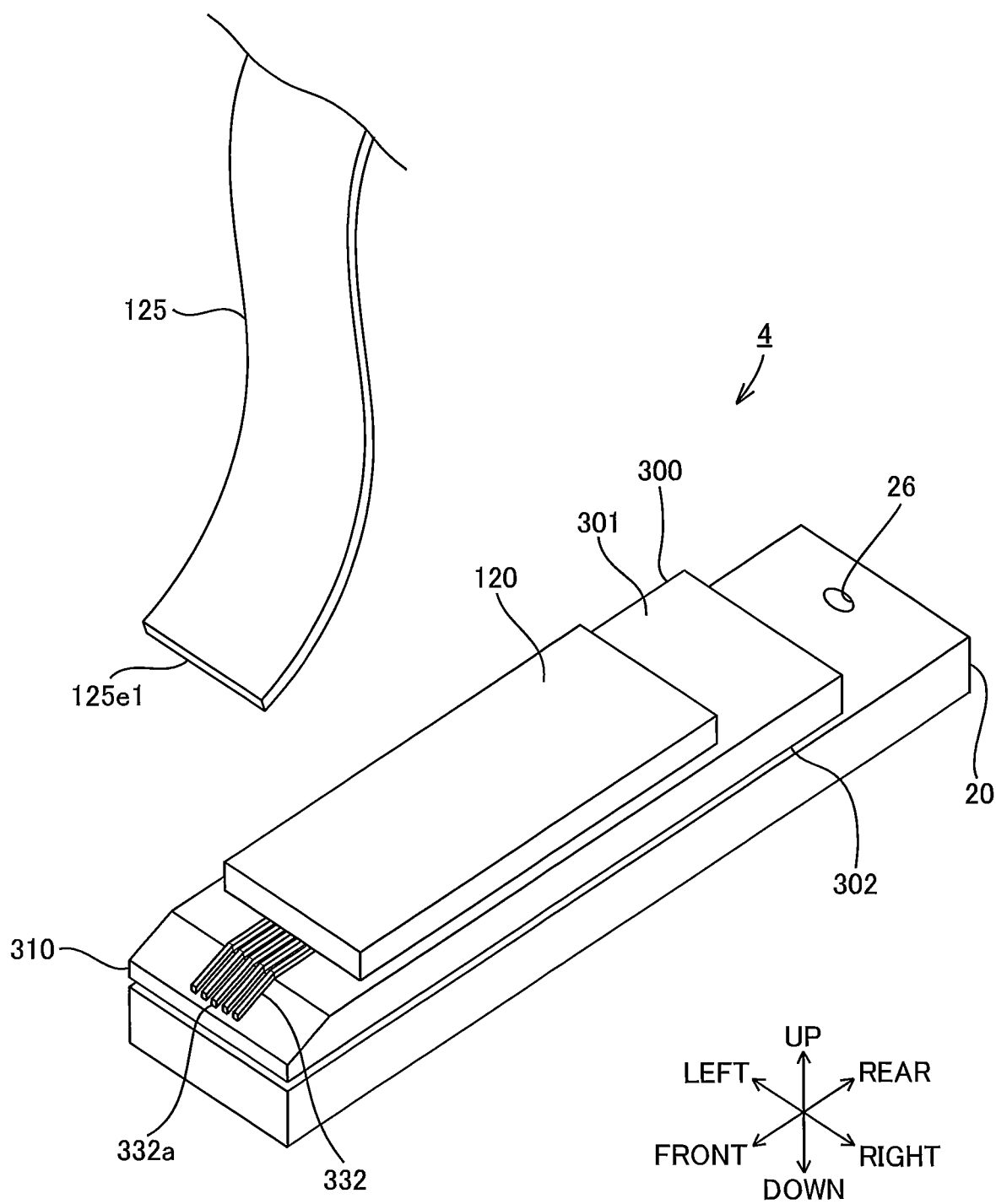
FIG. 2 is a perspective view of an inkjet head.
Figure 3:
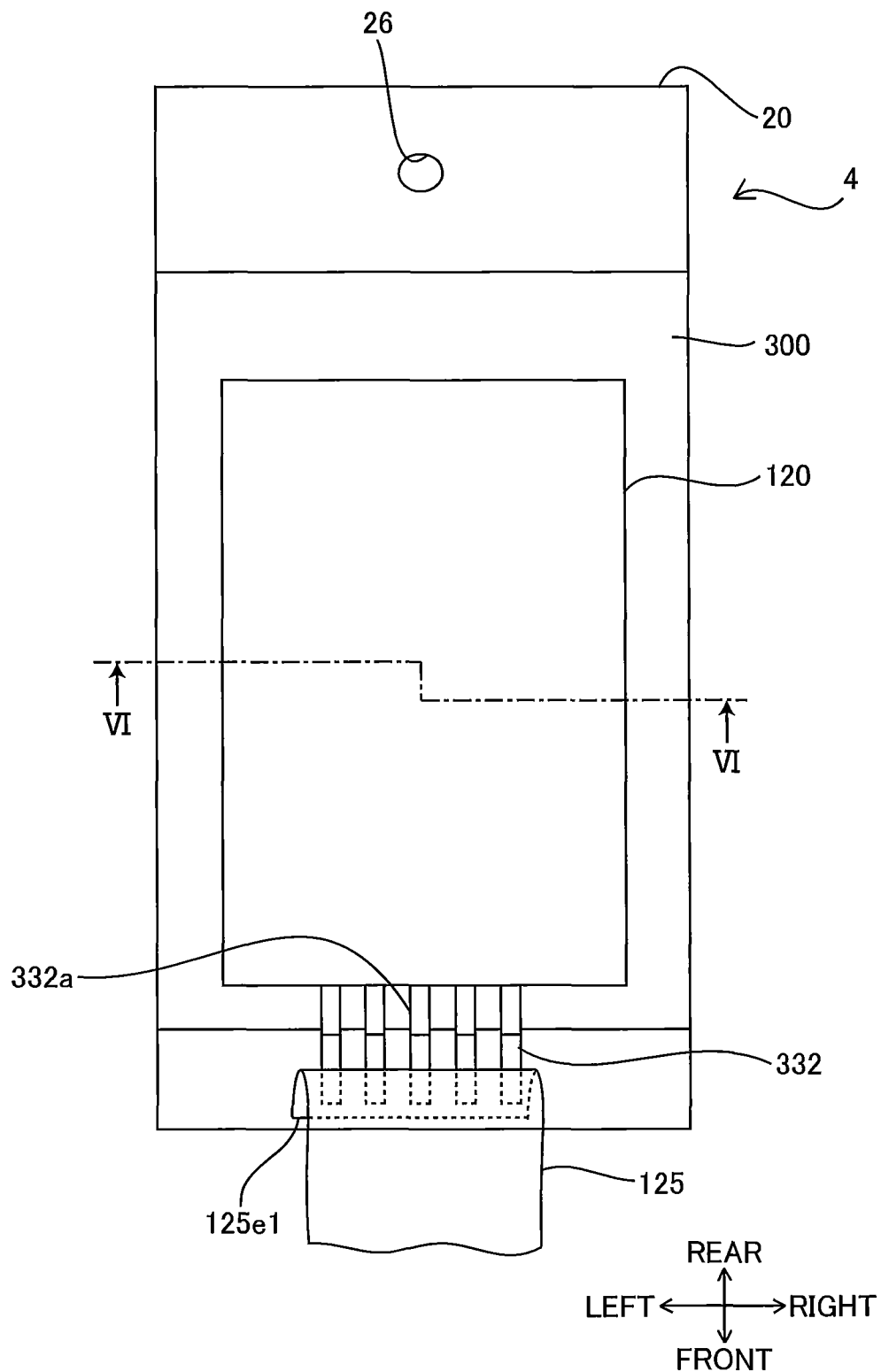
FIG. 3 is a plan view of an inkjet head.
Figure 4:
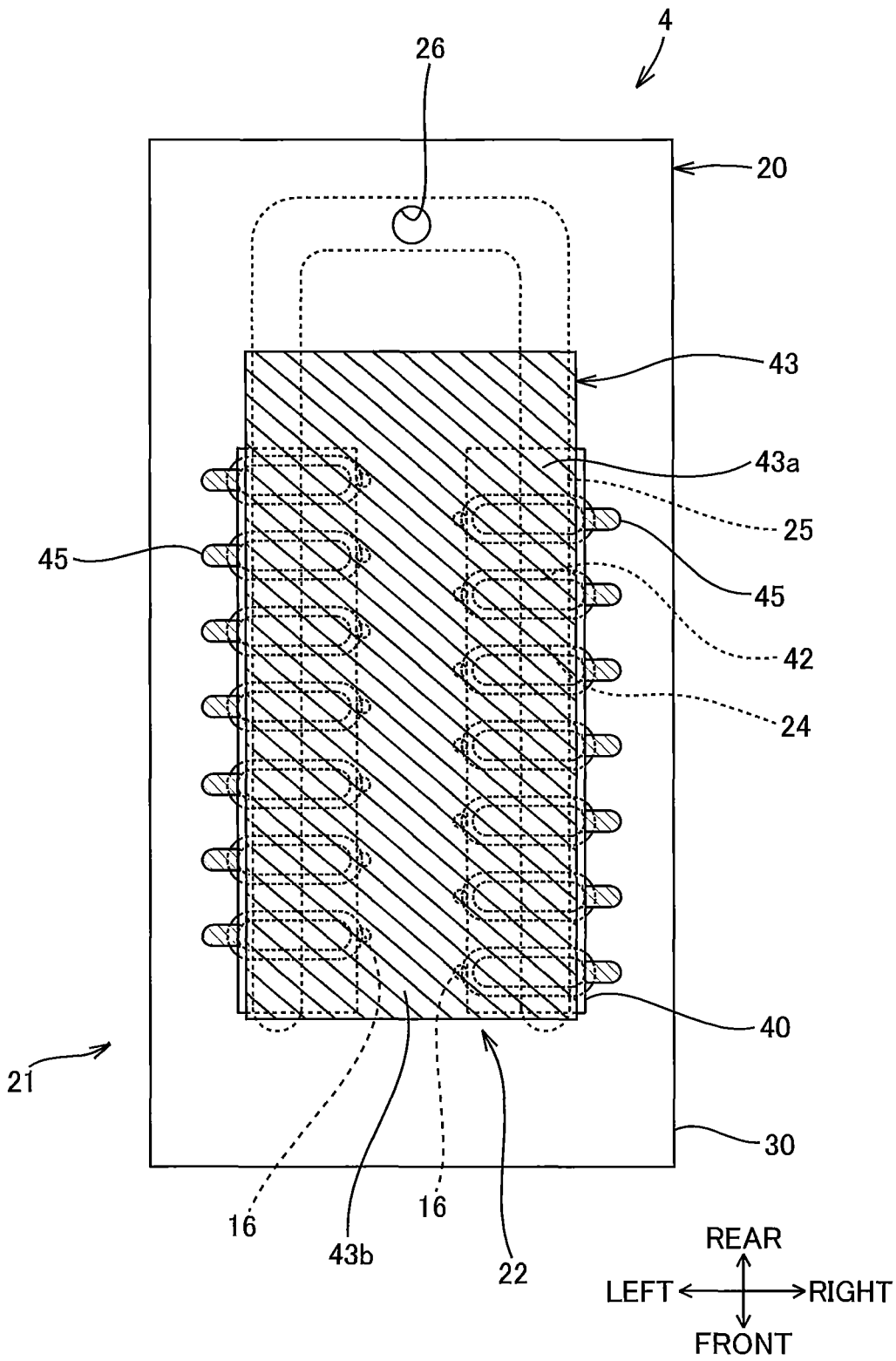
FIG. 4 is a plan view of an inkjet head (without a drive interconnect substrate)
Figure 5:
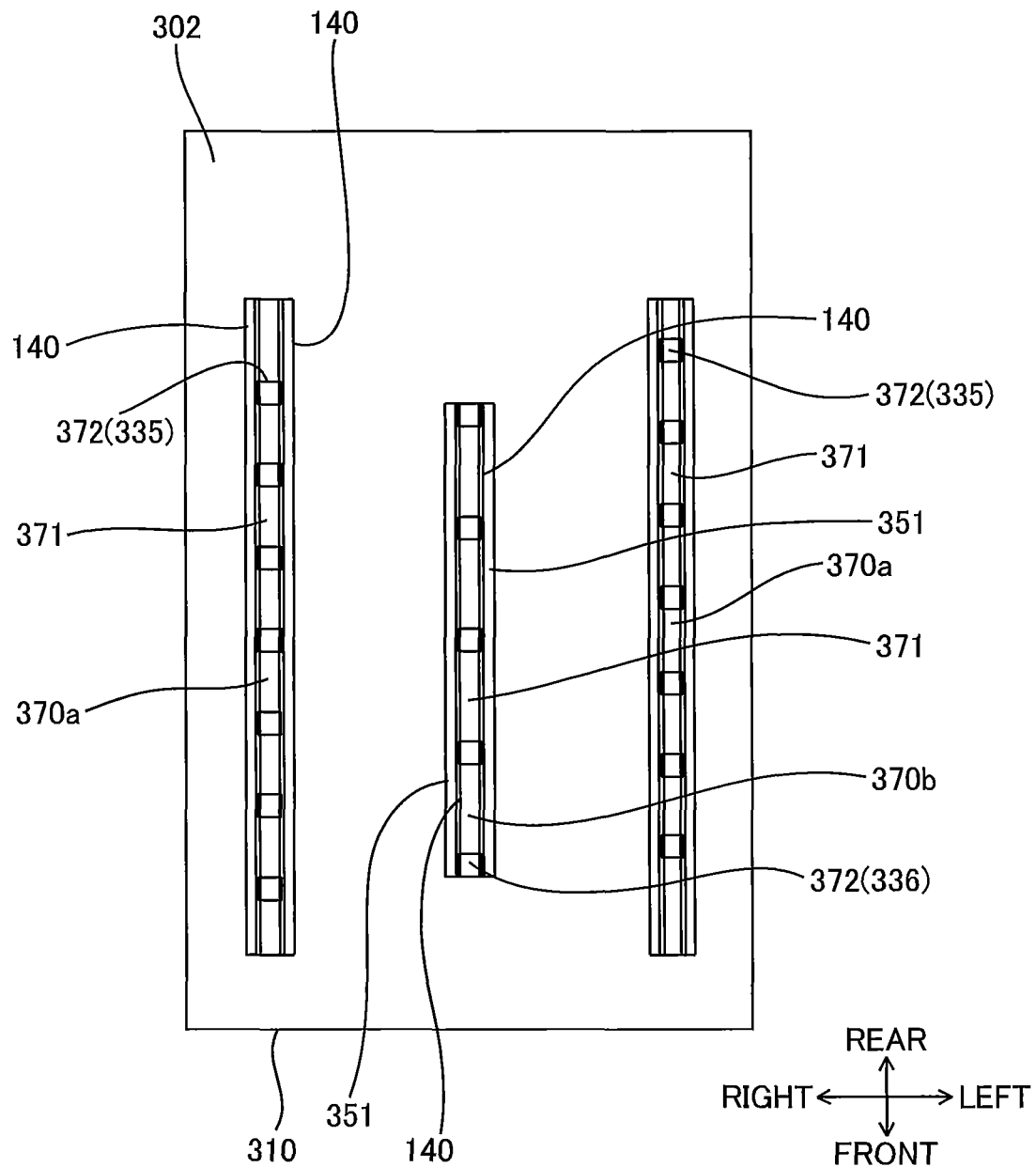
FIG. 5 is a bottom view of a drive interconnect substrate.
Figure 6:
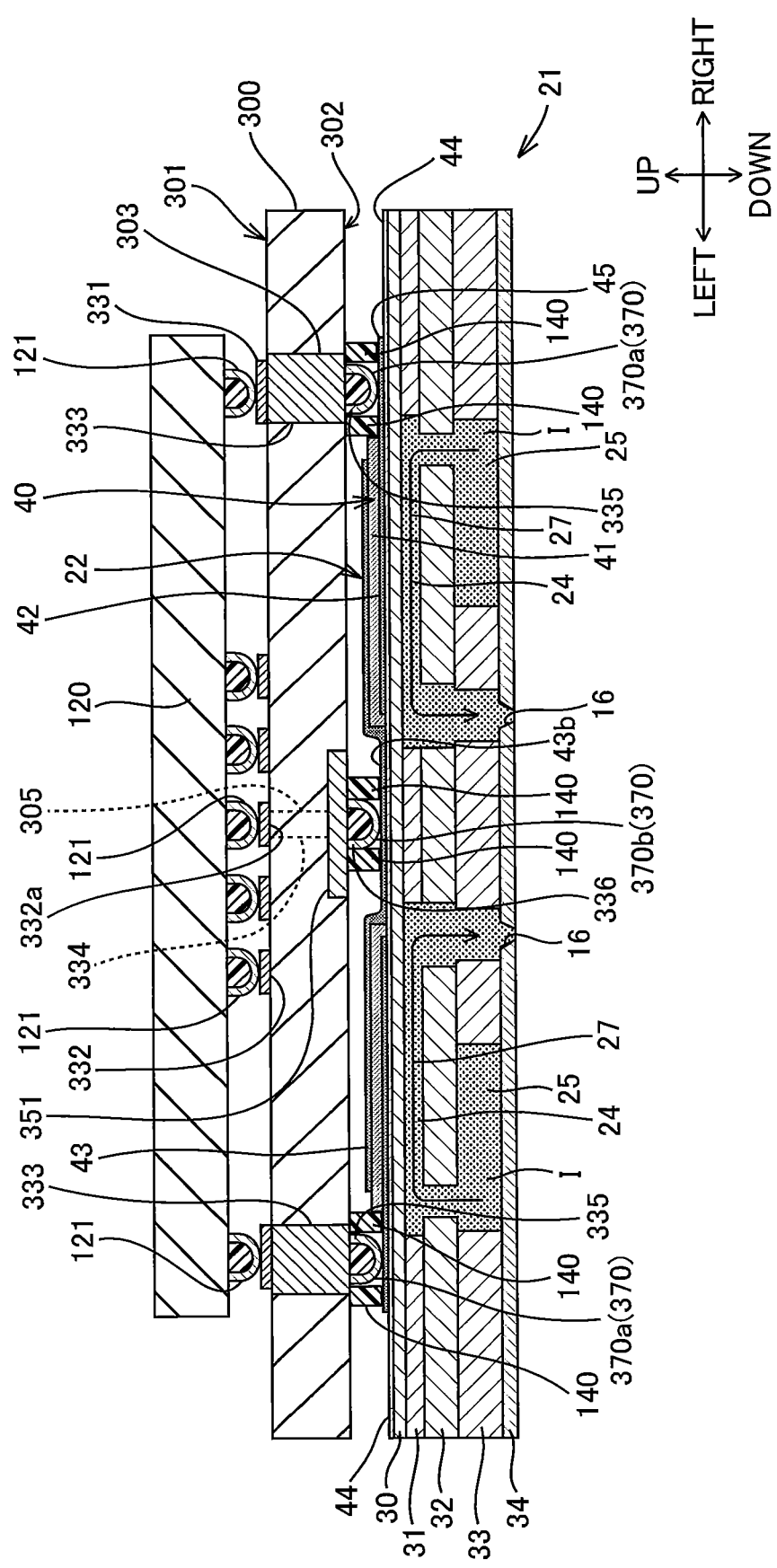
FIG. 6 is a cross-sectional view taken along the line VI-VI in FIG. 3.

Next, the inkjet head 4 will be described. FIGS. 2 and 3 are a perspective view and a plan view, respectively, of the inkjet head 4. FIG. 4 is a plan view of the inkjet head 4 without the driver IC 120 (an example of the first substrate) and the drive interconnect substrate 300 shown in FIG. 2. FIG. 5 is a bottom view of the drive interconnect substrate 300. FIG. 6 is a cross-sectional view of the inkjet head 4 taken along the line VI-VI in FIG. 3. The letter "I" in FIG. 6 denotes ink accommodated in ink channels. As shown in FIGS. 2 to 6, the inkjet head 4 includes a channel forming substrate 20 (an example of the third substrate), and the drive interconnect substrate 300 (an example of the second substrate).

<Channel Unit 21>

As shown in FIG. 6, the channel unit 21 has a layered structure comprising five plates 30-34. Multiple channel forming holes are formed in each of the plates 30-34. When the plates 30-34 are stacked together, the channel forming holes communicate with each other to form ink channels, as will be described below. Although not particularly limited to any material, the five plates 30-34 may be configured of metal plates formed of stainless steel or a nickel alloy steel, for example. In this embodiment, the plates 30-34 are made from single-crystal silicon substrates.

As shown in FIG. 4, an ink supply hole 26 is formed in the top surface of the channel unit 21. The ink supply hole 26 is connected to an ink cartridge (not shown). Two manifolds 25 are formed inside the channel unit 21. The manifolds 25 are elongated in the front-rear direction. Both manifolds 25 are connected to and share the single ink supply hole 26. Ink in the ink cartridge is supplied into the manifolds 25 through the ink supply hole 26.

As shown in FIG. 6, the channel unit 21 has a plurality of the nozzles 16, and a plurality of pressure chambers 24. The nozzles 16 are formed in the nozzle plate 34, which is the bottommost layer of the channel unit 21, and are open in the bottom surface of the channel unit 21. The pressure chambers 24 are in communication with respective nozzles 16. As shown in FIG. 4, the nozzles 16 are arranged in the bottom surface of the channel unit 21 (the surface facing the far side of the drawing in FIG. 4) in two rows extending in the front-rear direction. It is noted that the nozzles 16 in the two nozzle rows are arranged so as to be staggered relative to each other in the front-rear direction, i.e., so that the positions of the nozzles 16 in one row are offset in the front-rear direction from the positions of the nozzles 16 in the other row.

In a plan view, the pressure chambers 24 have a general elliptical shape that is elongated in the left-right direction. The pressure chambers 24 are arranged along the same plane. The vibration plate 30 covers the tops of the pressure chambers 24. The pressure chambers 24 are also arranged in two rows that are staggered relative to each other along the conveying direction (front-rear direction) to correspond with the positions of the nozzles 16. Each pressure chamber 24 is in communication with the corresponding nozzle 16 at one longitudinal end (left-right direction) of the pressure chamber 24. The positional relationships of the pressure chambers 24 and nozzles 16 are reversed between the left and right pressure chamber rows. That is, as shown in FIGS. 4 and 6, the nozzles 16 communicate with the right longitudinal ends of the corresponding pressure chambers 24 in the left pressure chamber row, while the nozzles 16 communicate with the left longitudinal ends of the corresponding pressure chambers 24 in the right pressure chamber row. With this arrangement, two nozzle rows are formed along the insides of the corresponding pressure chamber rows, as illustrated in FIG. 4.

The pressure chamber rows are arranged in positions that overlap the corresponding manifolds 25. Each pressure chamber 24 is in communication with the manifold 25 positioned directly beneath the pressure chamber 24. With this configuration, as shown in FIG. 6, a plurality of individual ink channels 27 is formed in the channel unit 21. Each individual ink channels 27 branches off from the corresponding manifold 25 and passes through the corresponding pressure chamber 24 to arrive at the corresponding nozzle 16.

<Piezoelectric Actuator 22>

Next, the piezoelectric actuator 22 will be described. The piezoelectric actuator 22 is disposed on the top surface of the vibration plate 30 constituting the channel unit 21. As shown in FIGS. 4 and 6, the piezoelectric actuator 22 has piezoelectric members 40, a plurality of individual electrodes 42, and a common electrode 43.

As shown in FIG. 6, an insulating layer 44 formed of an insulating material, such as a synthetic resin material, is formed over substantially the entire top surface of the vibration plate 30. The two piezoelectric members 40 are disposed on the top surface of the vibration plate 30 covered by the insulating layer 44. The piezoelectric members 40 are formed in rectangular shapes. The piezoelectric members 40 are oriented with their longitudinal dimensions aligned with the rows of pressure chambers 24 and cover the corresponding pressure chamber rows. The piezoelectric members 40 are formed of a material whose primary component is lead zirconate titanate (PZT). PZT is a ferroelectric solid solution of lead titanate and lead zirconate. Note that the piezoelectric members 40 may also be formed directly on the top surface of the vibration plate 30 covered by the insulating layer 44 through a well-known film formation technique, such as a sputtering method or a sol-gel method. Alternatively, the piezoelectric members 40 may be formed by pasting a thin green sheet to the vibration plate 30 after the green sheet has been sintered.

The plurality of drive electrodes 42 are formed in regions on the bottom surfaces of the piezoelectric members 40 that correspond to the pressure chambers 24. In a plan view, each drive electrode 42 has a general elliptical shape that is slightly smaller than the pressure chambers 24 and is arranged so as to confront the approximate center region of the corresponding pressure chamber 24. The drive electrodes 42 are electrically insulated from the vibration plate 30 by the insulating layer 44.

A plurality of drive terminals 45 are respectively connected to corresponding drive electrodes 42. Each of the drive terminals 45 is led over the insulating layer 44 from the corresponding drive electrode 42 toward the side opposite the corresponding nozzle 16 in the longitudinal direction of the drive electrode 42 (toward the outer side) to an area that does not oppose the pressure chamber 24. Thus, the plurality of drive terminals 45 are exposed on the outside of the piezoelectric members 40, as illustrated in FIGS. 4 and 6. Hence, the plurality of drive terminals 45 are arranged in rows extending in the front-rear direction along the outer left-right sides of two piezoelectric members 40. The plurality of drive terminals 45 are connected to a second individual interconnect 335. A predetermined drive voltage is applied to each of the plurality of drive electrodes 42.

In this embodiment, each second individual interconnect 335 is configured by a bump 370, and more specifically of a conducting film 372 disposed on a drive bump 370a.

Each bump 370 has a core part 371, and conducting films 372 that cover at least part of the surface of the core part 371. The mechanical structure of the bump 370 will be described later. The bump 370 is an example of the second bump in the present disclosure. In addition to the drive bumps 370a described above, the bumps 370 include a common drive bump 370b.

The common electrode 43 is formed across both piezoelectric members 40 so as to cover the entire top surfaces of the piezoelectric members 40. In FIG. 4, the common electrode 43 covering the two piezoelectric members 40 is depicted with hatching. Specifically, the common electrode 43 has two electrode parts 43a formed over the entire top surfaces of the respective piezoelectric members 40, and a connecting part 43b formed in the region on the top surface of the vibration plate 30 between the two piezoelectric members 40.

The connecting part 43b is elongated in the front-rear direction, extending along the long sides of the two rectangular piezoelectric members 40. The connecting part 43b is electrically insulated from the vibration plate 30 by the insulating layer 44. Further, since the connecting part 43b is formed on the top surface of the vibration plate 30, the vertical position of the connecting part 43b is lower than the two electrode parts 43a formed on the top surfaces of the piezoelectric members 40. As illustrated in the cross-sectional view of FIG. 6, the common electrode 43 is shaped with a concave depression at the connecting part 43b. The connecting part 43b opposes a partitioning part 21a of the channel unit 21 that partitions the two rows of pressure chambers 24. Hence, the connecting part 43b is disposed in a region on the top surface of the vibration plate 30 that does not oppose pressure chambers 24.

The connecting part 43b is connected to an interconnect 336 and maintained at a bias potential (the ground potential in this embodiment).

As shown in FIG. 6, the portions of the piezoelectric members 40 interposed between each of the drive electrodes 42 and the common electrode 43 (hereinafter called "piezoelectric elements 41") are the portions that deform when drive voltages are applied to the corresponding drive electrodes 42 and apply ejection energy to ink inside the corresponding pressure chambers 24, as will be described below. In this embodiment, by arranging a single piezoelectric member 40 across the plurality of pressure chambers 24 belonging to one row of pressure chambers, the piezoelectric elements 41 corresponding to this pressure chamber row are integrally configured. In addition, each of the plurality of piezoelectric elements 41 is polarized in the thickness direction.

When a drive voltage is applied to one of the individual electrodes 42 through the second individual interconnect (i.e., the drive bump 370a), an electric potential difference is produced between the drive electrode 42 and the common electrode 43, which is maintained at the ground potential. Consequently, an electric field along the thickness direction is generated in the portion of the piezoelectric member 40 between the electrodes 42 and 43 (i.e., the piezoelectric element 41). Since the direction of this electric field is equivalent to the direction of polarization in the piezoelectric element 41, the piezoelectric element 41 expands in its thickness direction and contracts along its planar direction. This contraction of the piezoelectric element 41 forces the vibration plate 30 that covers the pressure chamber 24 to warp into a convex shape toward the pressure chamber 24 side, thereby decreasing the capacity of the pressure chamber 24. As a result, pressure (ejection energy) is applied to the ink in the pressure chamber 24, causing an ink droplet to be ejected from the corresponding nozzle 16.

<Drive Interconnect Substrate 300>

As shown in FIGS. 2 and 6, the drive interconnect substrate 300 is bonded to the top surface of the channel forming substrate 20 (the surface on the piezoelectric actuator 22 side). The drive interconnect substrate 300 has substantially the same width (left-right dimension) as the channel forming substrate 20.

The bottom surface 302 of the drive interconnect substrate 300 faces the channel forming substrate 20. A driver IC 120 provided with a drive circuit is mounted on the top surface 301 of the drive interconnect substrate 300 (an example of the first surface). The driver IC 120 is a drive element that outputs signals for driving the piezoelectric actuator 22.

The drive interconnect substrate 300 is disposed on the channel forming substrate 20 so that its front-rear dimension aligned with the rows of piezoelectric elements 41 in the piezoelectric actuator 22 is its long dimension. In other words, the drive interconnect substrate 300 is oriented with its longitudinal dimension aligned in the front-rear direction and its latitudinal dimension aligned in the left-right direction. The drive interconnect substrate 300 is formed of the same material as the channel forming substrate 20, i.e., a single-crystal silicon substrate in this embodiment.

In addition, a plurality of first individual interconnects 331 and a plurality of feed interconnects 332 are provided on the top surface 301 of the drive interconnect substrate 300. The feed interconnects 332 include a bias interconnect 332a.

A plurality of the first individual interconnects 331 is aligned in the front-rear direction along each of the left and right sides of the drive interconnect substrate 300. Each of the first individual interconnects 331 is electrically connected to a corresponding bump 121 (an example of the first bump) of the driver IC 120 and a through-substrate interconnect 333 that penetrates the drive interconnect substrate 300 in its thickness direction, i.e., vertically. The mechanical structure of the bumps 121 will be described later in greater detail.

The through-substrate interconnects 333 are provided inside corresponding first through-holes 303 passing through the drive interconnect substrate 300 in the thickness direction, i.e., vertically, and constitute wiring that provides electrical conductance between the top surface 301 and the bottom surface 302 of the drive interconnect substrate 300. The through-substrate interconnects 333 are formed by filling these first through-holes 303 with a conductive material. The through-substrate interconnect 333 is an example of the through-substrate electrode. An imaginary line extending through the center of each through-substrate interconnect 333 in the thickness direction will be defined as a center X (see FIG. 7).

The bottom surface of each through-substrate interconnect 333 is electrically connected to a corresponding second individual interconnect 335. The second individual interconnect 335 is electrically connected to the drive electrode 42 for each of the piezoelectric elements 41 in the piezoelectric actuator 22. Thus, the first individual interconnects 331, through-substrate interconnects 333, and second individual interconnects 335 are each provided in the same number as the drive electrodes 42 in the piezoelectric actuator 22.

The feed interconnects 332 are wires that supply, from a flexible cable 125, power for the driver IC 120, ground (GND), drive signals (COM), a bias voltage (ground), and control signals for the driver IC 120. A plurality of the feed interconnects 332 is provided for the applications described above.

As shown in FIG. 2, the feed interconnects 332 extend to a position near a front end 310 of the drive interconnect substrate 300. The front ends of the extended feed interconnects 332 are electrically connected to the flexible cable 125 near a distal end 125e1 of the same. While not explicitly shown in the drawings, the proximal end of the flexible cable 125 is connected to control elements of a control circuit and the like. As described above, the flexible cable 125 supplies signals and the like from the control elements to the feed interconnects 332, including power, ground (GND), drive signals (COM), control signals for the driver IC 120, and a bias voltage (Vbs) to be applied to the common electrode 43 of the piezoelectric actuator 22. In this embodiment, the feed interconnect 332 that supplies the bias voltage (ground in the embodiment) to the common electrode 43 of the piezoelectric actuator 22 will be called the bias interconnect 332a. The bias interconnect 332a is electrically connected to both the driver IC 120 and the common electrode 43 of the piezoelectric actuator 22. Further, although not explicitly shown in the drawings, the other feed interconnects 332 are electrically connected to the driver IC 120 and are formed to provide power for high-voltage circuits and low-voltage circuits in the driver IC 120, ground (GND), drive signals (COM), control signals for the driver IC 120, and the like from the flexible cable 125 to the driver IC 120.

As shown in FIG. 6, the bias interconnect 332a, which is connected to ground, is electrically connected to a second through-substrate interconnect 334 provided in the drive interconnect substrate 300.

The second through-substrate interconnect 334 is formed inside a second through-hole 305 that vertically penetrates the drive interconnect substrate 300. The bias interconnect 332a covers the top surface of the second through-substrate interconnect 334 and is electrically connected to the same. As with the through-substrate interconnects 333 described above, the second through-substrate interconnect 334 may similarly be formed of copper (Cu) or another metal through a process such as electroplating or electroless plating.

In this way, the driver IC 120 is mounted on the top surface of the drive interconnect substrate 300 to be electrically connected to the first individual interconnects 331 and the feed interconnects 332 including the bias interconnect 332a via the bumps 121.

The second individual interconnects 335 connected to the through-substrate interconnects 333, and the interconnect 336 connected to the second through-substrate interconnect 334 via a bottom-surface embedded interconnect 351, are provided on the bottom surface 302 of the drive interconnect substrate 300. The interconnect 336 is electrically connected to the drive terminal 45 and the connecting part 43b.

In this embodiment, the interconnect 336 is configured by the conducting films 372 provided on the common drive bump 370b.

As shown in FIG. 6, the core part 371 corresponding to the common electrode 43 is layered over the bottom-surface embedded interconnect 351 formed on the bottom surface 302 of the drive interconnect substrate 300 (an example of the second surface) and electrically connects the bottom-surface embedded interconnect 351 to the common electrode 43. Here, at least a portion of the bottom-surface embedded interconnect 351 is embedded in the drive interconnect substrate 300. In this embodiment, the entire bottom-surface embedded interconnect 351 is embedded in the bottom surface 302 of the drive interconnect substrate 300, and the bottom-surface embedded interconnect 351 is elongated in the front-rear direction (i.e., along the rows of nozzles), as illustrated in FIG. 5. Accordingly, the surface of the bottom-surface embedded interconnect 351 on the bottom surface 302 side is substantially flush with the bottom surface 302 of the drive interconnect substrate 300.

The bottom-surface embedded interconnect 351 is connected to the corresponding second through-substrate interconnect 334 on the bottom surface 302 side. This second through-substrate interconnect 334 is connected to the bias interconnect 332a formed on the top surface 301 side of the drive interconnect substrate 300. Hence, the bottom-surface embedded interconnect 351 is connected to the bias interconnect 332a via the second through-substrate interconnect 334. The corresponding terminal of the flexible cable 125 is connected to this bias interconnect 332a and supplies voltage to the bias interconnect 332a that is common for each piezoelectric element 41.

By connecting the second individual interconnects 335 to the drive terminals 45, the driver IC 120 is electrically connected to the drive electrode 42 of each piezoelectric element 41 through the corresponding first individual interconnects 331, through-substrate interconnects 333, second individual interconnects 335, and drive terminals 45 and can supply drive signals to each piezoelectric element 41. Further, by connecting the interconnect 336 to the connecting part 43b, a bias voltage can be supplied from the flexible cable 125 to the common electrode 43 of the piezoelectric actuator 22.

In addition, spacers 140 are disposed on both sides of each bump 370. The spacers 140 form space between the channel forming substrate 20 and the drive interconnect substrate 300 for accommodating the piezoelectric actuator 22.

<Bumps>

As described above, each of the bumps 370 has a core part 371, and conducting films 372. The core part 371 is formed of an elastic resin material or the like. The conducting films 372 cover at least part of the surface of the core part 371.

The core part 371 is formed of a photosensitive insulating resin or a thermosetting insulating resin such as polyimide resin, acrylic resin, phenolic resin, silicone resin, silicone-modified polyimide resin, or epoxy resin.

Figure 7:
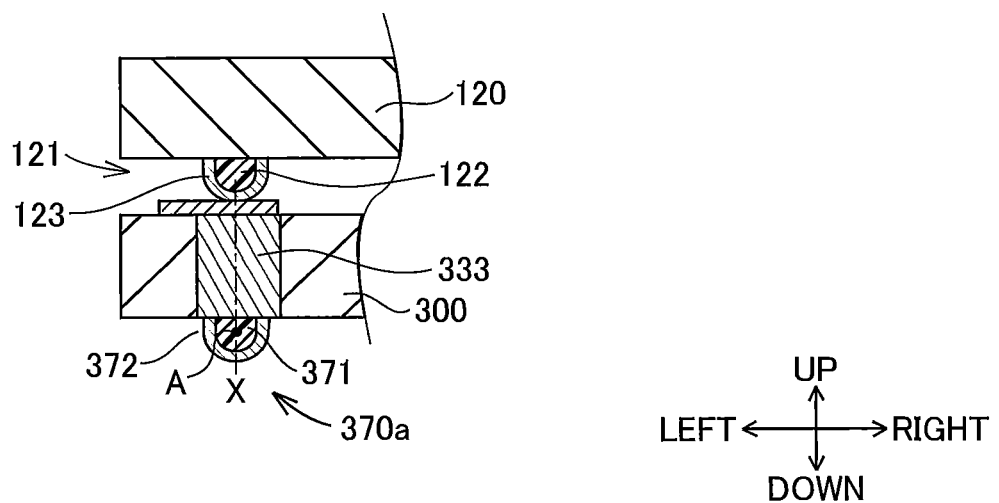
FIG. 7 is enlarged view of a part of FIG. 6, showing the arrangement around a drive bump without spacers.

As shown in FIGS. 6 and 7, the core part 371 has a general semicylindrical shape prior to the drive interconnect substrate 300 being connected to the channel forming substrate 20. Here, the term "semicylindrical" shape means that the inner surface of the core part 371 that contacts the drive interconnect substrate 300 (bottom surface) is flat, while the outer surface that does not contact the drive interconnect substrate 300 is curved. Specifically, the term "substantially semicylindrical shape" may include shapes whose cross section is substantially semicircular, substantially semielliptic, or substantially trapezoidal.

When the drive interconnect substrate 300 and channel forming substrate 20 are pressed against each other, the core part 371 elastically deforms so that its distal edge conforms to the surface shapes of the individual drive terminals 45 and connecting part 43b.

The bumps 370 and core parts 371 are formed continuously and linearly in the front-rear direction and have an axis A oriented in this extended direction (see FIG. 7). Pluralities of the bumps 370 and core parts 371 are juxtaposed in the left-right direction. In this embodiment, the core parts 371 include one on the outer left-right side of each of the two rows of piezoelectric elements 41 in the piezoelectric actuator 22, and one between the two rows of piezoelectric elements 41, for a total of three core parts 371. Each of the core parts 371 provided outside the rows of piezoelectric elements 41 in the piezoelectric actuator 22 constitutes a bump 370 for connecting the second individual interconnects 335 to the drive terminals 45. The core part 371 provided between the rows of piezoelectric elements 41 constitutes a bump 370 for connecting the interconnect 336 to the connecting part 43b of the piezoelectric actuator 22.

The conducting films 372 cover at least part of the surface of the core part 371. The conducting films 372 deform along with the elastic deformation of the core part 371 to conform with the surface shapes of the first individual interconnects 331 and the connecting part 43b and become electrically bonded to the drive terminals 45 and connecting part 43b. In this embodiment, the spacers 140 are disposed between the drive interconnect substrate 300 and the channel forming substrate 20, and the drive interconnect substrate 300 and channel forming substrate 20 are bonded together through the spacers 140, thereby maintaining the bumps 370 in their connected states with the drive terminals 45 and the connecting part 43b.

Each bump 121 has a core part 122, and conducting films 123. The core part 122 is formed of an elastic resin material, for example. The conducting films 123 cover at least part of the surface of the core part 122.

The core part 122 is formed of a photosensitive insulating resin or a thermosetting insulating resin having a greater hardness than that of the core part 371, such as a polyimide resin, acrylic resin, phenolic resin, silicone resin, silicon-modified polyimide resin, or epoxy resin. Hence, the core part 122 has a higher rigidity than the core part 371. In other words, the bump 370 has a lower rigidity than the bump 121.

When the drive interconnect substrate 300 and channel forming substrate 20 are pressed toward each other, the core part 122 elastically deforms so that its distal edge conforms with the surface shapes of the first individual interconnects 331.

As with the core part 371, the core part 122 has a general semicylindrical shape prior to the drive interconnect substrate 300 being bonded to the driver IC 120.

The bump 121 and core part 122 are formed continuously and linearly along the front-rear direction. Further, a plurality of the bumps 121 is juxtaposed in the left-right direction. As shown in FIGS. 6 and 7, each bump 121 and corresponding bump 370 are arranged so as to at least partially overlap vertically, i.e., when viewed along the thickness direction of the drive interconnect substrate 300.

Further, as shown in FIGS. 6 and 7, the bumps 370 and corresponding through-substrate interconnects 333 are arranged so as to at least partially overlap vertically, i.e., when viewed along the thickness direction of the drive interconnect substrate 300. A particular feature of the embodiment is that the center X of the through-substrate interconnect 333 and the axis A of the bump 370 and core part 371 are arranged at substantially the same left-right position. Further, the left-right width of the through-substrate interconnect 333 is greater than the left-right width of the bump 370.

<Comparative Example from the Prior Art>

Figure 11:
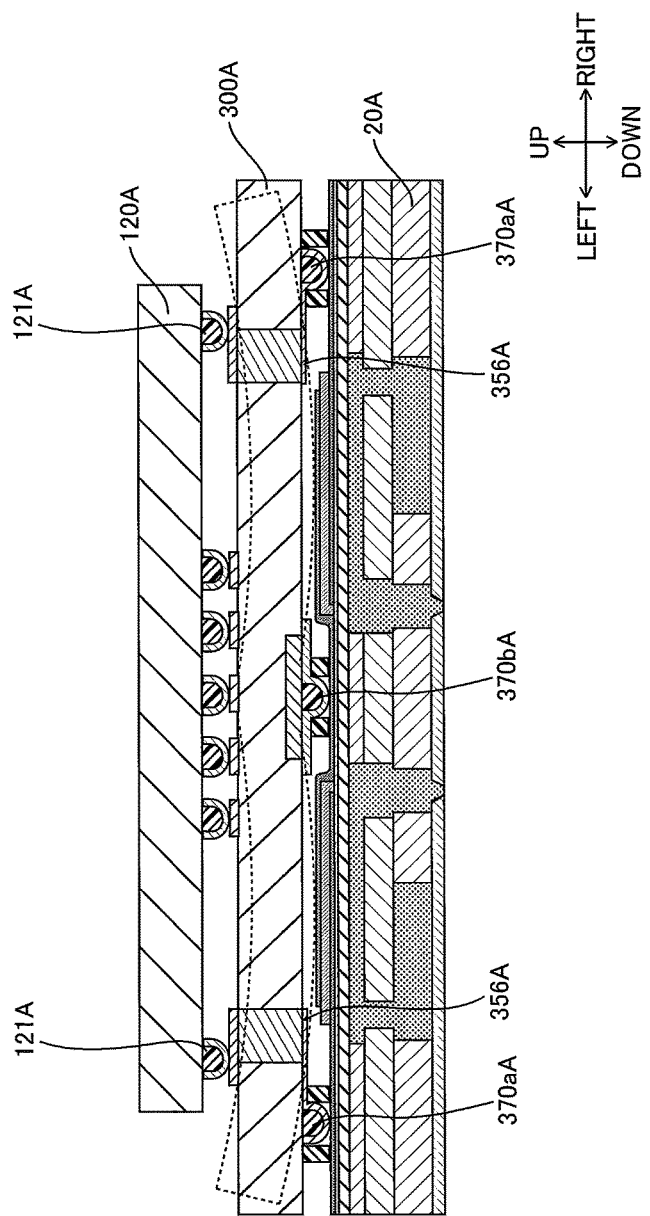
FIG. 11 is a cross-sectional view showing each substrate in a conventional inkjet printer.

Next, features of this embodiment will be described through a comparison with a conventional inkjet head. FIG. 11 shows a cross-sectional view of a driver IC 120A, a channel forming substrate 20A, and a drive interconnect substrate 300A in an inkjet head of the prior art. As shown in FIG. 11, while the inkjet head according to the prior art includes the driver IC 120A, drive interconnect substrate 300A, and channel forming substrate 20A similar to those in this embodiment, drive bumps 370aA and corresponding bumps 121A are offset from each other in the left-right direction. The drive bumps 370aA are electrically connected to through-substrate electrodes via interconnects 356A.

Since the driver IC 120A is bonded to the drive interconnect substrate 300A, it is necessary to press the drive interconnect substrate 300A from above through the driver IC 120A when manufacturing this type of inkjet head. When such pressure is applied to the drive interconnect substrate 300A via the bumps 121A, the drive interconnect substrate 300A bends into a shape depicted with a dashed line in FIG. 11.

When the drive interconnect substrate 300A bends in this way, sufficient pressure is not being applied at the points of contact between the bumps 121A and the drive interconnect substrate 300A, leading to the potential for bonding failure. In addition, such bending could cause deviations in the bonding positions.

<Effects of the Embodiment>

In this embodiment, on the other hand, the bumps 370 and corresponding bumps 121 are arranged so as to overlap vertically. This arrangement suppresses the occurrence of bending in the drive interconnect substrate 300, as described in the prior art.

By suppressing such bending in the drive interconnect substrate 300 when the driver IC 120 is pressed thereagainst, this embodiment reduces the occurrence of bonding failure, improving bonding yield. Further, by configuring the bumps 370 with a lower hardness than the bumps 121, the bumps 370 can deform effectively to further suppress deformation or bending of the drive interconnect substrate 300 when the driver IC 120 is pressed thereagainst, thereby improving the reliability of electrical bonds between substrates. This method also improves yield when manufacturing composite substrates formed by bonding the driver IC 120 to the drive interconnect substrate 300.

By arranging the bumps 370 to at least partially overlap corresponding through-substrate interconnects 333 when viewed along the thickness direction of the drive interconnect substrate 300, this embodiment can improve the reliability of electrical connections between the driver IC 120 and drive interconnect substrate 300, thereby improving bonding yield during manufacturing.

Increasing the surface area on the bottom surfaces of the through-substrate interconnects 333 in this embodiment increases the area that the through-substrate interconnects 333 can contact the corresponding conducting films 372. This construction improves the reliability of electrical connections between the through-substrate interconnects 333 and conducting films 372.

Stacking the drive interconnect substrate 300 and channel forming substrate 20 together with the bumps 370 interposed therebetween makes it possible to implement the functions of an ink ejection device comprising the piezoelectric elements 41 and pressure chambers 24. In this way, the driver IC 120 can be electrically connected to the channel forming substrate 20 by bonding the driver IC 120 to the channel forming substrate 20 via the bumps 370 and through-substrate interconnects 333.

Further, since the driver IC 120 is provided with a drive circuit, the driver IC 120 can drive the piezoelectric elements 41 via the bumps 370 and through-substrate interconnects 333.

<Positioning of Through-Substrate Interconnects and Bumps>

In a vertical view, the left-right positions of the center X of the through-substrate interconnect 333 and the axis A of the corresponding drive bump 370a are substantially the same in this embodiment, but the present disclosure is not limited to this arrangement.

FIGS. 8A through 8F are cross-sectional views showing the driver IC 120 and drive interconnect substrate 300 according to variations of the embodiment. To facilitate understanding, the spacers have been omitted from the drawings.

In FIGS. 8A through 8F and 9A through 9D, the drive bump 370a is formed so as to extend along the front-rear direction as in the above embodiment. However, the drive bump 370a is offset in the left-right direction from the center X of the through-substrate interconnect 333. In other words, the drive bump 370a is disposed in a position offset from the through-substrate interconnect 333 in a direction orthogonal to the axis A of the drive bump 370a and parallel to the bottom surface 302 of the drive interconnect substrate 300.

Figure 8A:
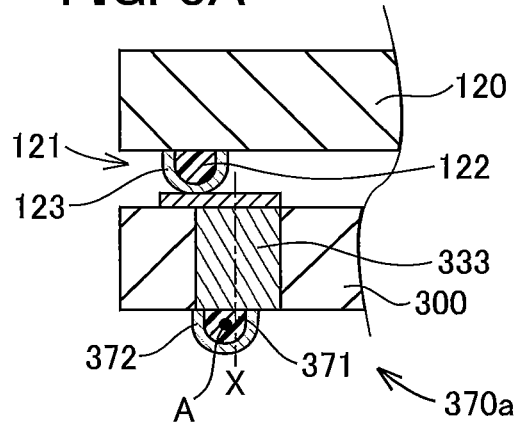
FIGS. 8A through 8F are views showing drive bumps, particularly, positional relationship between drive bump and bump according to variations.
Figure 8B:
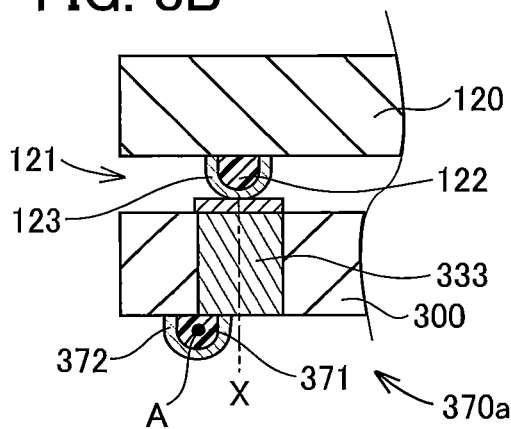
Figure 8C:
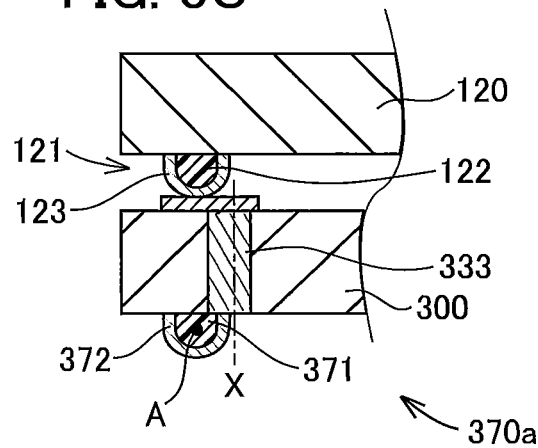

Offsetting the drive bump 370a and through-substrate interconnect 333 in this way can ensure that the portion of the through-substrate interconnect 333 electrically bonded to the drive bump 370a has sufficient surface area, even when the cross section of the through-substrate interconnect 333 is small, as in the example of FIG. 8C. Accordingly, this construction can improve the reliability of the electrical bond.

Figure 8D:
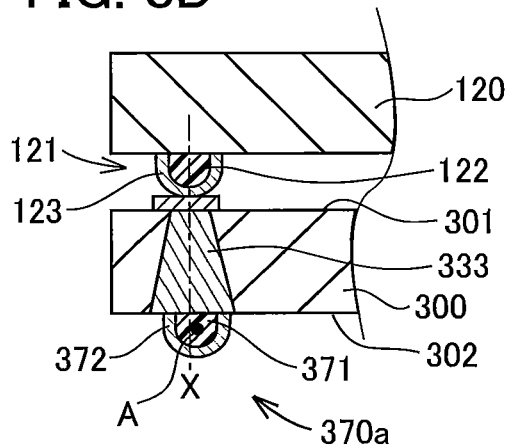

Thus, the present disclosure may be applied to a construction in which the drive bump 370a is offset relative to the center X of the through-substrate interconnect 333, as in these variations. In the example of FIG. 8D in particular, the drive bump 370a is offset from the through-substrate interconnect 333 in the direction away from the edge of the drive interconnect substrate 300. In the example of FIG. 8B, the drive bump 370a is offset from the through-substrate interconnect 333 in the direction toward the edge of the drive interconnect substrate 300.

When the drive bump 370a is offset from the center X of the corresponding through-substrate interconnect 333 in a direction away from the edge of the drive interconnect substrate 300 toward the center of the same, as in the example of FIG. 8D, the pitch between the drive bumps 370a in the left-right direction is reduced. This configuration can reduce the amount of bending in the drive interconnect substrate 300 when the driver IC 120 is pressed thereagainst.

When the drive bump 370a is offset in the direction toward the edge of the drive interconnect substrate 300, as in FIG. 8B, the size of the region on the bottom surface of the drive interconnect substrate 300 in which components and circuits can be arranged is increased, thereby improving flexibility of design. This variation particularly increases the flexibility for arranging the piezoelectric elements 41 and other components around the piezoelectric actuator 22.

<Dimensions of the Through-Substrate Interconnect>

In this embodiment, the through-substrate interconnect 333 has larger outer dimensions than the drive bump 370a, but the present disclosure is not limited to this configuration. As shown in FIG. 8C, the through-substrate interconnect 333 may have an outer dimension in the left-right direction that is equal to or smaller than that of the drive bump 370a. In this case, electrical bonds between the through-substrate interconnects 333 and the conducting films on the drive bumps 370a can be maintained by offsetting the corresponding drive bump 370a and through-substrate interconnect 333 in the front-rear or left-right direction.

With this arrangement, the corresponding through-substrate interconnect 333 and drive bump 370a at least partially overlap when viewed vertically, i.e., along the thickness direction of the substrates. Further, the conducting films 372 of the drive bump 370a contact the corresponding through-substrate interconnect 333. Hence, an electrical bond can be formed between the drive bumps 370a and corresponding through-substrate interconnects 333.

Alternatively, the through-substrate interconnect 333 may be configured with a substantially trapezoidal cross section so that its width increases toward the bottom, as illustrated in FIG. 8D. In other words, the through-substrate interconnect 333 may be formed with a trapezoidal shaped cross section so that its outer dimension increases from the top surface 301 of the drive interconnect substrate 300 toward the bottom surface 302, as illustrated in FIG. 8D. This configuration increases the area of the contacting surfaces between the conducting film 372 and through-substrate interconnect 333, improving the reliability of electrical connections between the conducting films 372 and through-substrate interconnects 333.

<Rigidity of the Bumps>

Figure 8E:
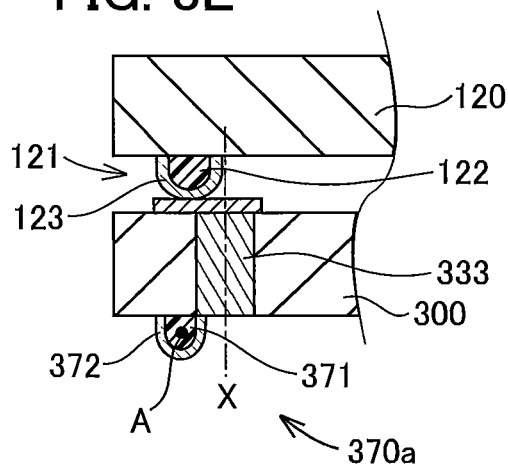

In the above embodiments, the core part 371 of the bump 370 is formed of a different material from the core part 122 of the bump 121, but the present disclosure is not limited to this configuration. In the variation of FIG. 8E, the core part 122 and core part 371 are formed of the same material. However, the bump 370 is configured to have less rigidity than the bump 121 by setting the width of the core part 371 in the left-right direction smaller than the width of the core part 122.

Figure 8F:
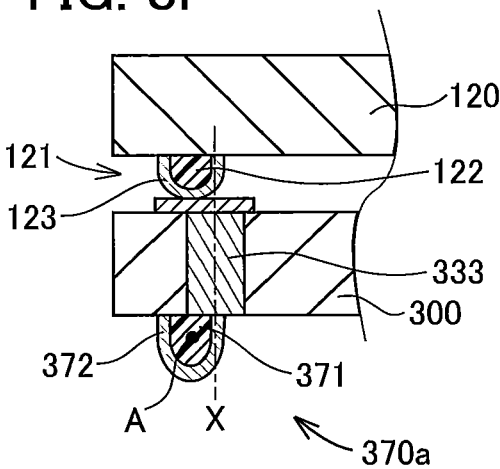

In another variation shown in FIG. 8F, the core part 122 and core part 371 are formed of the same material. However, the bump 370 is configured to have less rigidity than the bump 121 by setting the vertical height of the core part 371 greater than that of the core part 122.

<Relative Positions of Bumps>

In the above embodiments, the left-right positions of the bumps 121 and corresponding drive bumps 370a are substantially aligned when viewed along a vertical direction, but the present disclosure is not limited to this configuration. As shown in the variations of FIGS. 8A through 8F, the corresponding bump 121 and drive bump 370a may be offset in the left-right or front-rear direction so that the bump 121 and drive bump 370a partially overlap each other in a vertical view, i.e., when viewed along the width direction of the drive interconnect substrate 300.

<Positions of the Through-Substrate Interconnects 333 and Conducting Films 372>

In the above embodiments, corresponding through-substrate interconnects 333 and conducting films 372 are aligned vertically, with the conducting film 372 arranged so as to cover the through-substrate interconnect 333, but the present disclosure is not limited to this configuration. The conducting film 372 may be offset from the through-substrate interconnect 333. FIGS. 9A through 9D are bottom views of the drive interconnect substrate 300 according to variations of the embodiment showing the positional relationship of the through-substrate interconnect 333 and the drive bump 370a. To facilitate understanding, extraneous structures such as the spacers 140 have been omitted from the drawings.

Figure 9A:
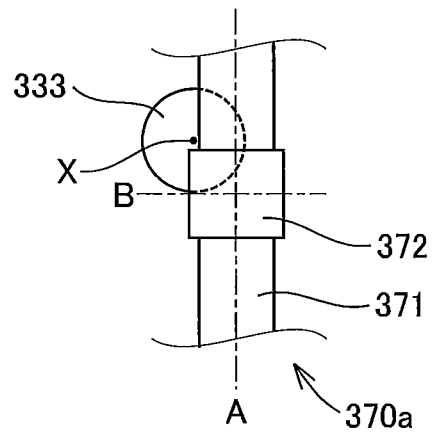
FIGS. 9A through 9D are bottom views showing a variation of drive interconnect substrate, particularly positional relationship between first through-substrate interconnect and drive bump.
Figure 9B:
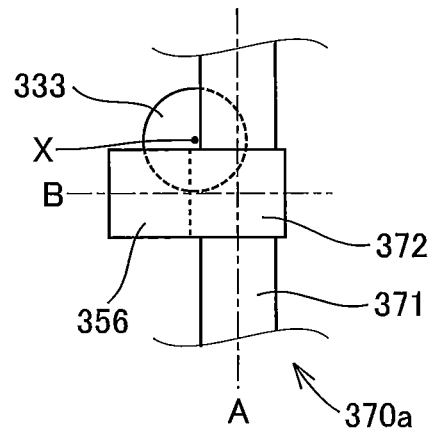
Figure 9C:
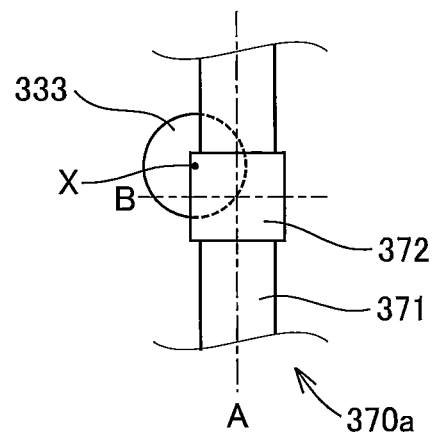
Figure 9D:
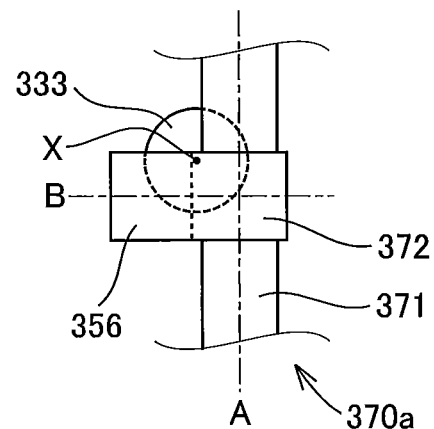
Figure 9D:
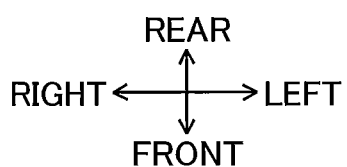

In FIGS. 9A through 9D, a front-rear center B of the conducting film 372 is offset from the center X of the through-substrate interconnect 333 so that a portion of the through-substrate interconnect 333 is not covered by the conducting film 372. Specifically, the center X of the through-substrate interconnect 333 and the center B of the conducting film 372 are offset in the direction along the axis A of the drive bump 370a. Note that the through-substrate interconnect 333 and conducting film 372 can be offset along the direction of the axis A of the drive bump 370a within a range in which the two components can remain in contact with each other. Allowing the conducting film 372 to be offset from the through-substrate interconnect 333 in this way improves flexibility of design on the surface of the drive interconnect substrate 300. As shown in FIGS. 9B and 9D, an interconnect 356 is arranged so as to extend in the left right direction and is configured to connect to the conducting film 372. Accordingly, this configuration can increase the area of contact with the through-substrate interconnect 333, improving the reliability of the electrical connection between the through-substrate interconnect 333 and conducting film 372.

<Materials and Properties of the Bumps>

The present disclosure is not limited to forming the bumps 370 of a resin material and the conducting films 372. For example, the bumps 370 may be configured merely of a conductive metal material, such as solder. Further, while the bumps 370 are formed in a semicylindrical shape in the above embodiments, the bumps 370 may be formed in a semispherical shape instead, for example.

While each bump 121 is consist of the core part 122 and conducting films 123 in the above embodiments, the present disclosure is not limited to this construction. For example, the bump 121 may be formed merely of a conductive metal material. Further, while the bumps 121 are formed in a semicylindrical shape in the above embodiments, the bumps 121 may be formed in a semispherical shape instead, for example.

In the above embodiments, each of the bumps 370 and 121 is elongated in the longitudinal direction of the inkjet head 4 and is covered by a corresponding conducting film 372 or 123 for each terminal. However, the present disclosure may be applied to a configuration providing a bump 370 or 121 for each individual terminal.

Figure 10:
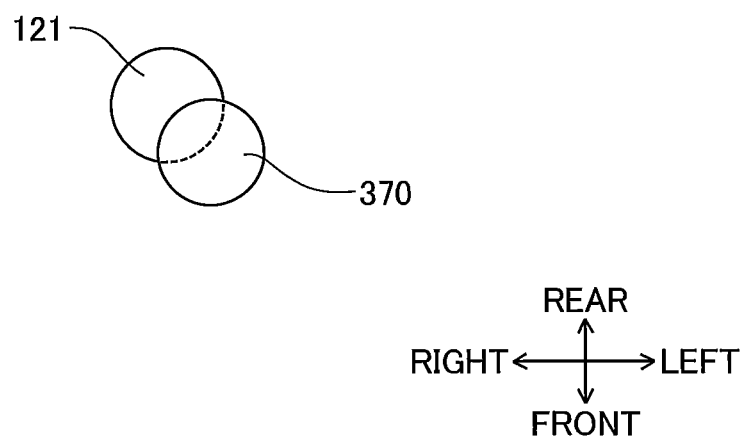
FIG. 10 is a bottom view of another variation of a drive interconnect substrate, showing positional relationship between a bum of a drive IC and a drive bump of drive interconnect substrate.

FIG. 10 is a bottom view of the drive interconnect substrate 300 according to another variation of the embodiment. In FIG. 10, the bump 121 and bump 370 are depicted vertically in phantom. Both of the bumps 121 and 370 are configured in a semispherical shape and protrude downward from the bottom surface of the driver IC 120 and the bottom surface 302 of the drive interconnect substrate 300, respectively. The bumps 121 and 370 are arranged at positions offset from each other in the left-right direction or front-rear direction while at least partially overlapping in a vertical view.

While the embodiment and its variations described above apply the liquid ejecting device of the present invention to an inkjet head, the composite substrate of the invention is not limited to devices used in applications that apply pressure to a liquid. The present invention may be used in other applications, such as displacing or generating vibrations in a plurality of solid driving objects by arranging a plurality of piezoelectric elements on a substrate and driving the piezoelectric elements with a driver IC to deform the substrate.

What is claimed is:

1. A composite substrate comprising:
a first substrate having a first bump protruding therefrom; and
a second substrate having a first surface and a second surface opposite to the first surface, the second surface having a second bump protruding therefrom; and
a third substrate, the first substrate, the second substrate, and the third substrate being laminated one on another in a thickness direction perpendicular to the first surface of the second substrate such that the second substrate is disposed between the first substrate and the third substrate in the thickness direction, the first surface of the second substrate confronts the first substrate and the second surface of the second substrate confronts the third substrate, the first bump is disposed between the first substrate and the second substrate such that the first bump is in contact with the first surface of the second substrate, and the second bump is disposed between the second substrate and the third substrate such that the second bump is in contact with the third substrate; wherein
the first bump and the second bump are partially overlapped with each other as viewed in the thickness direction, and the second bump has a rigidity which is lower than a rigidity of the first bump.

2. The composite substrate according to claim 1, wherein the second substrate further comprises an electrically conductive through-electrode, the electrically conductive through-electrode including electrically conductive material filled in an inside of a through-hole which is formed in the second substrate to extend between the first surface and the second surface of the second substrate in the thickness direction, the second bump and the electrically conductive material filled in the inside of the through-hole being partially overlapped with each other as viewed in the thickness direction.

3. The composite substrate according to claim 2, wherein the second bump comprises a core, and an electrically conductive film formed on the core and in contact with the through-electrode.

4. The composite substrate according to claim 3, wherein the core has a center offset from a center of the through-electrode as viewed in the thickness direction.

5. The composite substrate according to claim 4, wherein the second bump extends in parallel to the second surface and defines an axis, the axis and the center of the through-electrode being offset from each other in a direction perpendicular to the axis as viewed in the thickness direction.

6. The composite substrate according to claim 5, wherein the axis is deviated from the center of the through-electrode in a direction toward an end portion of the second substrate as viewed in the thickness direction.

7. The composite substrate according to claim 5, wherein the axis is deviated from the center of the through-electrode in a direction away from an end portion of the second substrate as viewed in the thickness direction.

8. The composite substrate according to claim 5, wherein the center of the through-electrode and a center of the electrically conductive film are offset from each other in an extending direction of the axis as viewed in the thickness direction.

9. The composite substrate according to claim 3, wherein each of the through-electrode and the core defines a width in a direction perpendicular to the thickness direction, the width of the through-electrode being greater than a width of the core.

10. The composite substrate according to claim 2, wherein the through-electrode defines a width in a direction perpendicular to the thickness direction, the width of the through-electrode being increased in a direction from the first surface toward the second surface.

11. The composite substrate according to claim 3, wherein the third substrate provides a pressure chamber and a nozzle opening in communication with the pressure chamber, wherein the third substrate comprises:
a vibration plate having a first surface facing in a direction toward the second substrate along the thickness direction and a second surface opposite to the first surface of the vibration plate and defining a part of the pressure chamber;
a piezoelectric element provided at the first surface of the vibration plate; and
a drive electrode provided between the piezoelectric element and the first surface of the vibration plate, the drive electrode being electrically connected with the electrically conductive film of the second bump.

12. The composite substrate according to claim 11, wherein the first substrate further comprises a driver circuit to drive the piezoelectric element.

* * * * *